United States Patent
Koch et al.

(10) Patent No.: US 10,320,216 B2
(45) Date of Patent: Jun. 11, 2019

(54) ESTIMATION OF CHARGE ACCEPTANCE CAPABILITY IN A BATTERY ASSEMBLY

(71) Applicant: GM GLOBAL TECHNOLOGY OPERATIONS LLC, Detroit, MI (US)

(72) Inventors: Brian J. Koch, Berkley, MI (US); Robert S. Conell, Sterling Heights, MI (US)

(73) Assignee: GM Global Technology Operations LLC., Detroit, MI (US)

( * ) Notice: Subject to any disclaimer, the term of this patent is extended or adjusted under 35 U.S.C. 154(b) by 490 days.

(21) Appl. No.: 15/147,451

(22) Filed: May 5, 2016

(65) Prior Publication Data

US 2017/0324254 A1    Nov. 9, 2017

(51) Int. Cl.
| | | |
|---|---|---|
| *G01R 31/00* | (2006.01) | |
| *H02J 7/00* | (2006.01) | |
| *G01R 31/36* | (2019.01) | |

(52) U.S. Cl.
CPC .......... *H02J 7/007* (2013.01); *G01R 31/3648* (2013.01); *H02J 7/0047* (2013.01)

(58) Field of Classification Search
USPC .......................... 324/426–432; 320/124–127
See application file for complete search history.

(56) References Cited

U.S. PATENT DOCUMENTS

| | | | | |
|---|---|---|---|---|
| 2010/0327810 A1* | 12/2010 | Jimbo | ................... | B60W 10/26 320/126 |
| 2013/0314052 A1* | 11/2013 | Nomoto | ................ | H02J 7/1446 320/155 |

* cited by examiner

*Primary Examiner* — Vincent Q Nguyen
(74) *Attorney, Agent, or Firm* — Quinn IP Law

(57) ABSTRACT

A battery assembly includes a battery having first and second electrodes and an electrolyte. A controller is operatively connected to the battery. The controller includes a processor and tangible, non-transitory memory on which is recorded instructions for executing a method for estimating a charge acceptance capability of the battery. Interaction of the electrolyte and at least one of the first and second electrodes produces a discharge product. The controller is programmed to quantize and track both accumulation and removal of the discharge product when at least one enabling condition is met. The controller is programmed to initialize a timer when the enabling condition is met and increment the timer by a calculation time interval ($\Delta t$).

16 Claims, 3 Drawing Sheets

ESTIMATION OF CHARGE ACCEPTANCE CAPABILITY IN A BATTERY ASSEMBLY

TECHNICAL FIELD

The present disclosure relates to estimation of charge acceptance capability in a battery assembly.

BACKGROUND

Batteries, such as lead-acid batteries, are employed in a wide variety of devices, including but not limited to motor vehicles. The performance of batteries, particularly their charge acceptance capability, may be challenging to predict using common battery modeling techniques.

SUMMARY

A battery assembly includes a battery having first and second electrodes and an electrolyte. A controller is operatively connected to the battery. The controller includes a processor and tangible, non-transitory memory on which is recorded instructions for executing a method for estimating a charge acceptance capability of the battery. Discharging the battery causes a discharge product to precipitate on the surface of the electrodes, whereas charging reverses the process and removes the product. Execution of the method by the processor causes the controller to track both accumulation and removal of the discharge product when at least one enabling condition is met.

The controller is programmed to quantize the accumulation and the removal of the discharge product as discharge quanta and charge quanta, respectively. The controller is programmed to initialize a timer when the enabling condition is met and increment the timer by a calculation time interval ($\Delta t$). The assembly includes a current sensor operatively connected to and configured to obtain a measured current ($I_m$) of the battery. A voltage sensor is operatively connected to the controller and configured to obtain a measured voltage of the battery.

The controller may be programmed to obtain the measured current ($I_m$), via the current sensor. If the measured current ($I_m$) is negative, a discharge quantum is added to a first one of a set of bins, the discharge quantum being equal to the integration of measured current ($I_m$) with respect to time over the period that the measured current ($I_m$) remains negative. A voltage value (V) is obtained based at least partially on the measured current ($I_m$), the calculation time interval ($\Delta t$) and a predetermined set of battery circuit model parameters that are unique to each of the bins. The time interval of the voltage and current calculations ($\Delta t$) may be on the order of 0.1 sec.

A bin time interval ($t_{bin}$) triggers the advance of the discharge quantum through the bins. The bin time interval ($t_{bin}$) will be longer than the calculation time interval ($\Delta t$) but consistent with the interval for calculation time interval ($\Delta t$), i.e., an integer multiple of the calculation time interval ($\Delta t$). The bin time interval ($t_{bin}$) may be on the order of 10 min. If the bin time interval ($t_{bin}$) has elapsed, then the controller may be programmed to advance the discharge quanta to a next one of the set of bins and reset the timer. The predetermined set of parameters include an open-circuit voltage ($V_0$), a circuit resistance ($R_o$), a diffusion voltage at a time t ($V_{diff(t)}$), and a time constant ($\tau$) of a circuit having a double-layer capacitance ($C_{dl}$), a double-layer voltage ($V_{dl}$) and a charge transfer resistance ($R_{ct}$). The voltage value (V) at a time t may be defined as: $V(t)=[V_0+I_m*R_0+(I_m*\Delta t/C_{dl})+V_{dl(t-\Delta t)}*\exp(-\Delta t/\tau)+V_{diff(t-\Delta t)}]$.

The controller may be programmed to obtain the measured voltage ($V_m$), via the voltage sensor. If the measured voltage ($V_m$) is greater than an open-circuit voltage ($V_0$), charging is indicated and a charge acceptance current (I) is obtained based at least partially on the battery circuit model parameters associated with a newest occupied one of the set of bins. A charge quantum is obtained by integrating charge acceptance current (I) with respect to time over the period during which V remains greater than $V_0$. A quantity equal to the charge quantum is removed from the newest occupied one of the set of bins.

The charge acceptance current (I) may be based at least partially on the measured voltage ($V_m$), the open-circuit voltage ($V_0$), the time calculation time interval ($\Delta t$), a circuit resistance ($R_o$), a diffusion voltage ($V_{diff(t)}$) at a time t ($V_{diff(t)}$) and a time constant ($\tau$) of a circuit having a double-layer capacitance ($C_{dl}$) and a charge transfer resistance ($R_{ct}$). The charge acceptance current (I) at a time t may be defined as $I(t)=(F_1/F_2)$, such that $F_1=[V_m-V_0-V_{dl(t-\Delta t)}*\exp(-\Delta t/\tau)-V_{diff(t-\Delta t)}]$ and $F_2=[R_0+(\Delta t/C_{dl})]$.

The discharge quanta and charge quanta are assigned to one of the set of bins according to a respective age, and each of the set of bins includes a respective set of circuit model parameters. The set of circuit model parameters are characteristic of the respective age of the bins. The circuit model parameters associated with each bin may be both age and temperature dependent. The method makes use of a common circuit model representation of the battery, but allows the parameters associated within the circuit to change with respect to the age and quantity of the deposit. The method permits accurate estimation of battery behavior and enables device energy balance simulation, energy storage system design, and onboard battery controls for a mobile device.

The above features and advantages and other features and advantages of the present disclosure are readily apparent from the following detailed description of the best modes for carrying out the disclosure when taken in connection with the accompanying drawings.

DESCRIPTION

Figure 1:
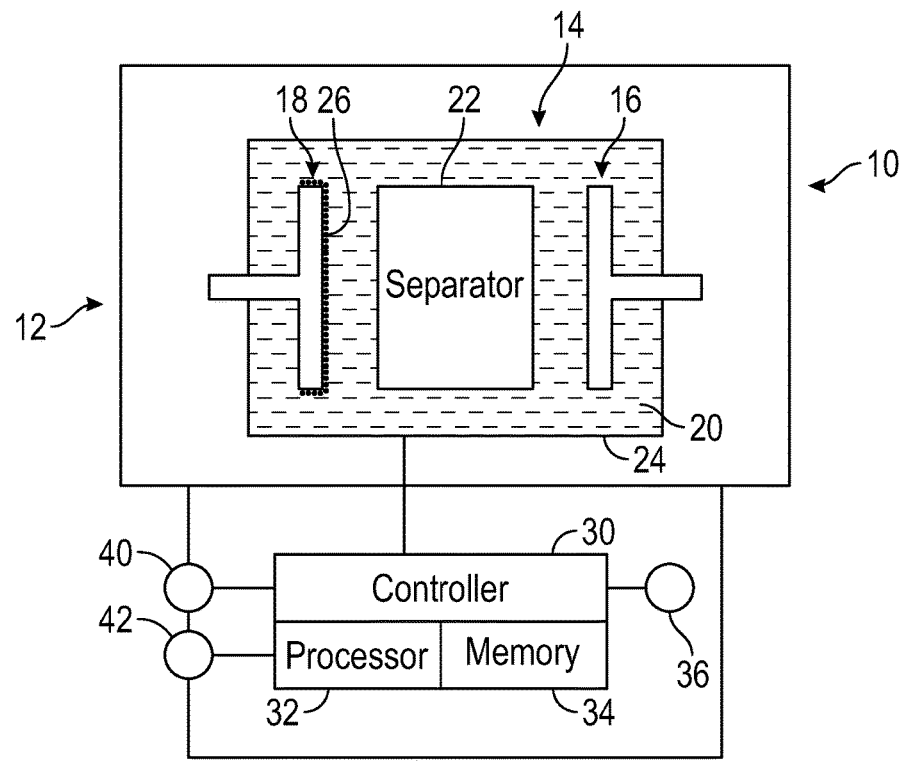
FIG. 1 is a schematic illustration of a battery assembly having a controller.

Referring to the drawings, wherein like reference numbers refer to like components, FIG. 1 schematically illustrates a battery assembly 10. The battery assembly 10 may be part of a device 12. The device 12 may be a mobile platform, such as, but not limited to, standard passenger car, sport utility vehicle, light truck, heavy duty vehicle, ATV, minivan, bus, transit vehicle, bicycle, robot, farm implement, sports-related equipment, boat, plane, train or any other transportation device. The device 12 may be a nonmobile platform. The device 12 may take many different forms and include multiple and/or alternate components and facilities.

Referring to FIG. 1, the assembly 10 includes a battery 14 with first and second electrodes 16, 18, submersed in an electrolyte 20. The first and second electrodes 16, 18 may be composed of lead. The first electrode 16 may be a positive plate covered with a paste of lead dioxide. The second electrode 18 may be a negative plate made of sponge lead. The electrolyte 20 may include water and sulfuric acid ($H_2SO_4$). Other materials known to those skilled in the art may be employed for the first and second electrodes 16, 18 and the electrolyte 20. A separator 22 may be placed in between the first and second electrodes 16, 18 to prevent contact between them. The first and second electrodes 16, 18 may be enclosed in a cover 24. The size of the first and second electrodes 16, 18 and the amount of electrolyte 20 affects the amount of charge the battery may accept.

When the battery 14 is in a charged state and connected to a load, such as a light bulb (not shown), the chemical reaction between the electrolyte 20 and the first and second electrodes 16, 18 produces electricity. The discharge reaction produces a discharge product 26 which is deposited on one or both of the first and second electrodes 16, 18. In the discharge reaction shown below, the discharge product 26 at the first (positive) and second (negative) electrodes, 16, 18, respectively, is lead sulfate ($PbSO_4$).

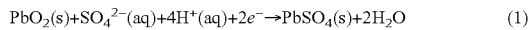

$$PbO_2(s)+SO_4^{2-}(aq)+4H^+(aq)+2e^- \rightarrow PbSO_4(s)+2H_2O \quad (1)$$

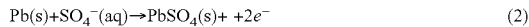

$$Pb(s)+SO_4^{-}(aq) \rightarrow PbSO_4(s)+ +2e^- \quad (2)$$

The quantity of discharge product 26 accumulated during a given discharge event constitutes a deposit that will subsequently age and sinter. The molecules of the discharge product 26 sinter as they are formed, coalescing into bigger-sized deposits. The discharge product 26 may be measured in amp-hours. As is known, an ampere-hour or amp-hour (also denoted Ah) is a unit of electric charge equal to the charge transferred by a steady current of one ampere flowing for one hour. Sintering reduces the active surface area, increases resistance and curtails charge acceptance. The charge acceptance is the amount of current input that the battery 14 can accept at any given moment of time. As the battery 14 continues to discharge, the discharge product 26 coats more and more of the first and second electrodes 16, 18 and the voltage of the battery 14 begins to decrease from the fully charged state.

Referring to FIG. 1, the assembly 10 includes a controller 30 operatively connected to or in electronic communication with the battery 14. Referring to FIG. 1, the controller 30 includes at least one processor 32 and at least one memory 34 (or any non-transitory, tangible computer readable storage medium) on which are recorded instructions for executing method 100, shown in FIG. 2, for estimating a charge acceptance capability of the battery 14. The method 100 accounts for the sintering effect in real-time.

The controller 30 of FIG. 1 is specifically programmed to execute the steps of the method 100 (as discussed in detail below with respect to FIG. 2) and can receive inputs from various sensors. A current sensor 40 may be operatively connected to the controller 30 and the battery 14. The current sensor 40 is configured to obtain a measured current ($I_m$) of the battery 14. A voltage sensor 42 may be operatively connected to the controller 30 and the battery 14. The voltage sensor 42 is configured to obtain a measured voltage ($V_m$) of the battery 14. The assembly 10 may employ a timer 36 that tracks time since key-on of the device 12, expires and resets when a bin time interval ($t_{bin}$) is reached. For example, the bin time interval ($t_{bin}$) may be 10 minutes. The timer 36 may be integral with the controller 30.

Figure 2:
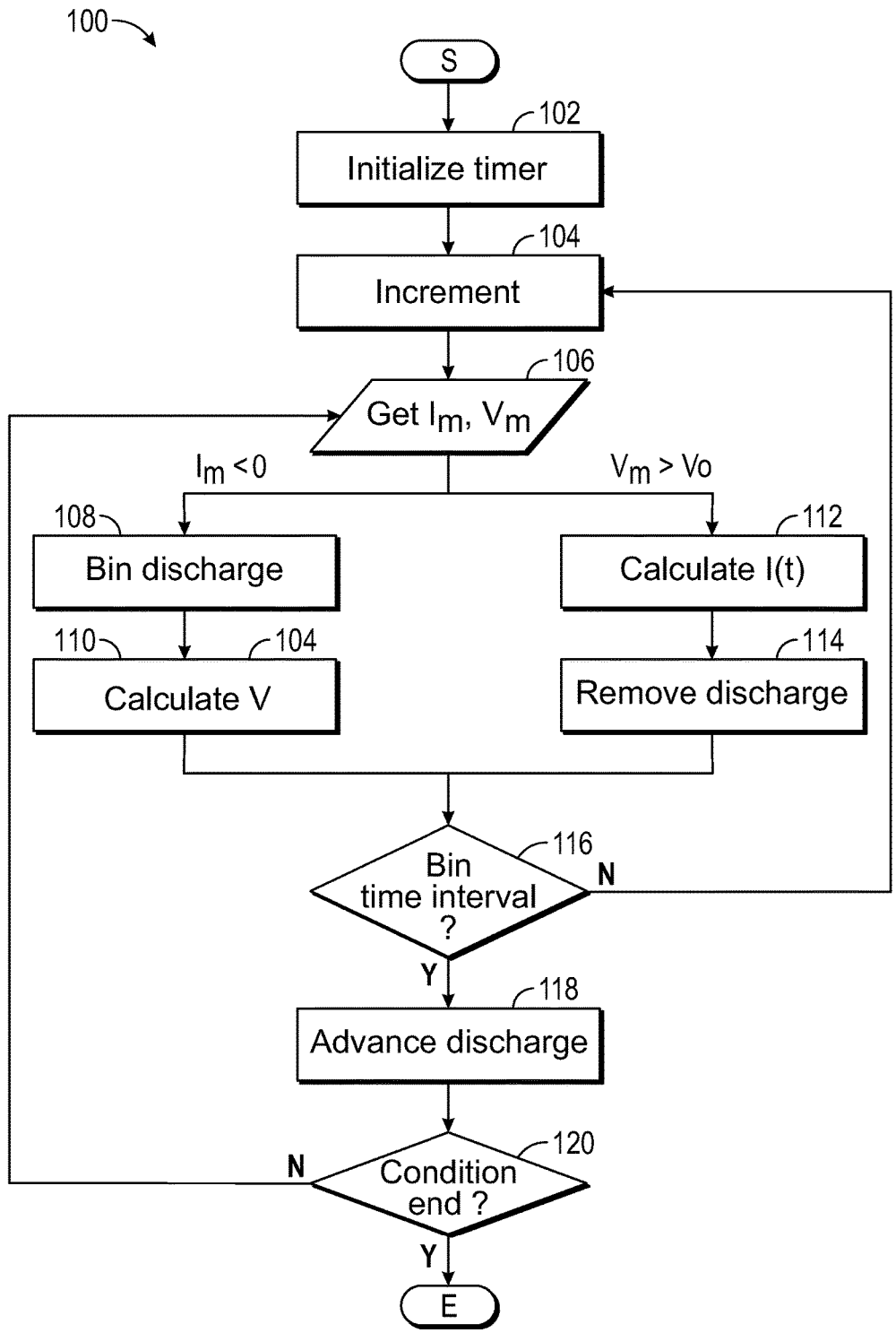
FIG. 2 is a schematic flow diagram for a method executable by the controller of FIG. 1.

Referring to FIG. 2, a flowchart of the method 100 stored on and executable by the controller 30 of FIG. 1 is shown. The method 100 tracks the accumulation and removal of the discharge product 26 of the battery 14 over the course of time. Method 100 need not be applied in the specific order recited herein. Furthermore, it is to be understood that some steps may be eliminated. The memory 34 can store controller-executable instruction sets, and the processor 32 can execute the controller-executable instruction sets stored in the memory 34. The start and end of method 100 are shown by "S" and "E", respectively.

Referring to FIG. 2, method 100 may begin with block 102, where the controller 30 is programmed or configured to initialize the timer 36 when at least one enabling condition is met. Any enabling condition suitable for the application may be placed. The enabling condition may be that the device 12 is powered or turned on. The enabling condition may be that the state of charge of the battery 14 is at a threshold value. The state of charge (SOC) is the percentage of the total amount of energy stored in the battery relative to the total energy storage capacity.

If the enabling condition is met, in block 104 of FIG. 2, the controller 30 is programmed to increment the timer 36 by the calculation time interval ($\Delta t$). The calculation time interval ($\Delta t$) will increment at short intervals, such as for example, 0.1 second or 1 second. The controller 30 is programmed to quantize the accumulation and the removal of the discharge product as discharge quanta and charge quanta, respectively. Quantizing refers to converting a continuous range of values into a finite range of discrete values or restricting a parameter to discrete values rather than to a continuous set of values. The data is divided into a set of bins 304 (shown in FIG. 4B below). The discharge quanta and charge quanta are assigned to one of the bins 304 according to age. Each one of the bins 304 has an age-dependent set of circuit model parameters for predicting charge current. A bin time interval ($t_{bin}$) triggers the advance of the discharge quantum through the bins. The bin time interval ($t_{bin}$) will be longer than the calculation time interval ($\Delta t$) but consistent with the interval for calculation time interval ($\Delta t$). The bin time interval ($t_{bin}$) may be on the order of 10 min. A quantum of discharge product 26 deposited at t=0 will yield less current if charged after aging 40 minutes than if charged after aging 10 minutes, and even less current if charged after being allowed to age until t=80 minutes.

In block 106 of FIG. 2, the controller 30 is programmed to obtain the measured current ($I_m$) and measured voltage ($V_m$) from the current sensor 40 and voltage sensor 42, respectively. If the measured current ($I_m$) is negative, the method 100 proceeds to block 108. If the measured voltage ($V_m$) is greater than an open-circuit voltage ($V_O$), the method 100 proceeds to block 112, as described below.

In block 108 of FIG. 2, the controller 30 is programmed to add discharge quanta (measured in Ah and proportional to the measured current ($I_m$)) to a first one of the set of bins 304 and proceed to block 110. All the discharge quanta that accrue over a bin time interval ($t_{bin}$) are binned together and considered to be of the same age.

In block 110 of FIG. 2, the controller 30 is programmed to calculate a voltage value (V) based at least partially on a predefined circuit model or set of parameters. The voltage value may be defined as:

$$V(t)=V_0+I_m*R_o+(I_m*\Delta t/C_{dl})+V_{dl(t-\Delta t)}*\exp(-\Delta t/\tau)+V_{diff(t-\Delta t)} \quad (3)$$

Here $V_0$ is the open-circuit voltage, $I_m$ is the measured current of the battery and $\Delta t$ is the calculation time interval. The time constant ($\tau$) is the time constant of a circuit associated with the charge-transfer effect and containing a double-layer capacitance ($C_{dl}$) and charge transfer resistance ($R_{ct}$). The diffusion voltage ($V_{diff(t)}$) is associated with a mass transport effect at a time t. The value of $V_{diff(t)}$ may be assumed to change slowly with respect to the time interval of the calculation, allowing the use of the value from the previous time step. Each of the age-dependent parameters may be obtained by calibration in test cell or laboratory conditions.

Referring back to block 106 of FIG. 2, if the measured voltage ($V_m$) is greater than an open-circuit voltage ($V_0$), the method 100 proceeds to block 112. In block 112, the controller 30 is programmed to calculate a charge acceptance current (I) based at least partially on parameters of the newest occupied of the bins. The calculated current is defined as $I(t)=(F_1/F_2)$, such that:

$$F_1 = [V_m - V_0 - V_{dl(t-\Delta t)} * \exp(-\Delta t/\tau) - V_{diff(t-\Delta t)}]; \text{ and} \quad (4)$$

$$F_2 = [R_o + (\Delta t/C_{dl})]. \quad (5)$$

As in equation (3), here $V_0$ is the open-circuit voltage, $V_m$ is the measured voltage of the battery and $\Delta t$ is the calculation time interval. The time constant ($\tau$) is the time constant of a circuit associated with the charge-transfer effect and containing a double-layer capacitance ($C_{dl}$) and charge transfer resistance ($R_{ct}$). The diffusion voltage ($V_{diff(t)}$) is associated with a mass transport effect at a time t. Each of the age-dependent parameters may be obtained by calibration in test cell or laboratory conditions. The magnitude of the charge acceptance current drops in response to age and diminishing quantities of the discharge product 26 available for charging.

In block 114 of FIG. 2, the controller 30 is programmed to calculate charge quanta (measured in Ah) for the present time step, using the charge acceptance current (I) from block 112, and remove the discharge quanta from the newest occupied of the set of bins 304. The discharge quanta to be removed may be calculated as [I*$\Delta$t]. Stated differently, the discharge quanta (in Ah) are removed by charging in the order that they were formed (newest first). Model parameters change as charging exhausts the discharge quanta in one bin and then moves on to deplete the next bin.

In block 116 of FIG. 2, the controller 30 is programmed to determine if the timer 36 has reached the bin time interval ($t_{bin}$), for example, if 10 minutes have elapsed. If the bin time interval ($t_{bin}$) has been reached, the method proceeds to block 118. If not, the method 100 loops back to block 104 and the timer 36 is incremented.

In block 118 of FIG. 2, the controller 30 is programmed to advance each of the discharge quanta to a next one of the set of bins 304 and reset the timer 36. As the discharge quanta are directly advanced through the bins 304, the charge quanta proceed or indirectly advance via removal of discharge quanta. The discharge quanta are advanced one time bin with the passing of each bin time interval ($t_{bin}$) (e.g. 10 minutes).

In block 120 of FIG. 2, the controller 30 determines if the enabling condition remains. For example, if the device 12 is an automobile and the drive has ended, the method 100 is ended. If not, the method 100 proceeds back to block 104 and the steps are repeated.

Figure 3:
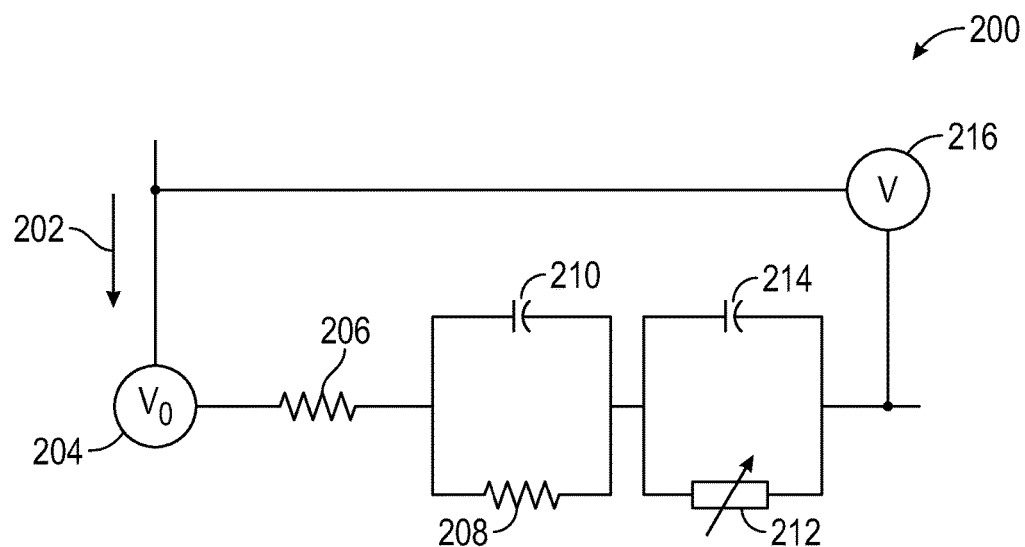
FIG. 3 is a schematic diagram of an example circuit model that may be employed in the method of FIG. 2.

Referring to FIG. 3, an example circuit model 200 that may be employed in block 110 (and block 112) is shown. It is to be appreciated that the circuit model 200 is presented as a non-limiting example and any other circuit model known to those skilled in the art may be employed. Referring to FIG. 3, the circuit model 200 includes an ammeter 202 adapted to measure the current (I) and a voltage source 204 that varies with the state of charge and temperature of the battery. The circuit model 200 is defined by an open-circuit voltage ($V_0$) and a base resistor 206 having a base resistance ($R_0$). The circuit model 200 employs a charge-transfer resistor 208 ($R_{ct}$) and a double-layer capacitor 210 ($C_{dl}$) to represent charge transfer effects. The circuit model 200 employs a diffusion resistor 212 ($R_{diff}$) and a diffusion capacitor 214 ($C_{diff}$) to represent mass transport effects. A voltmeter 216 may be employed to measure the battery voltage (V).

In summary, the discharge and charge events are quantized in ampere-hours (Ah) and assigned to a set of bins 304 according to their age. New discharge quanta enter a first bin (time "t"=0, Deposit Age "DA"=0) from the set of bins 304, then progress through subsequent ones of the bins 304 at bin time interval ($t_{bin}$) intervals (e.g. 10 minutes) as they age. Thus, a discharge quanta is added to the t=0 segment whenever a discharge event occurs. The discharge quanta are removed sequentially from the set of bins 304 in order of newest to oldest. Model parameters for predicting charge current are specific to the bin being accessed.

Figure 4A:
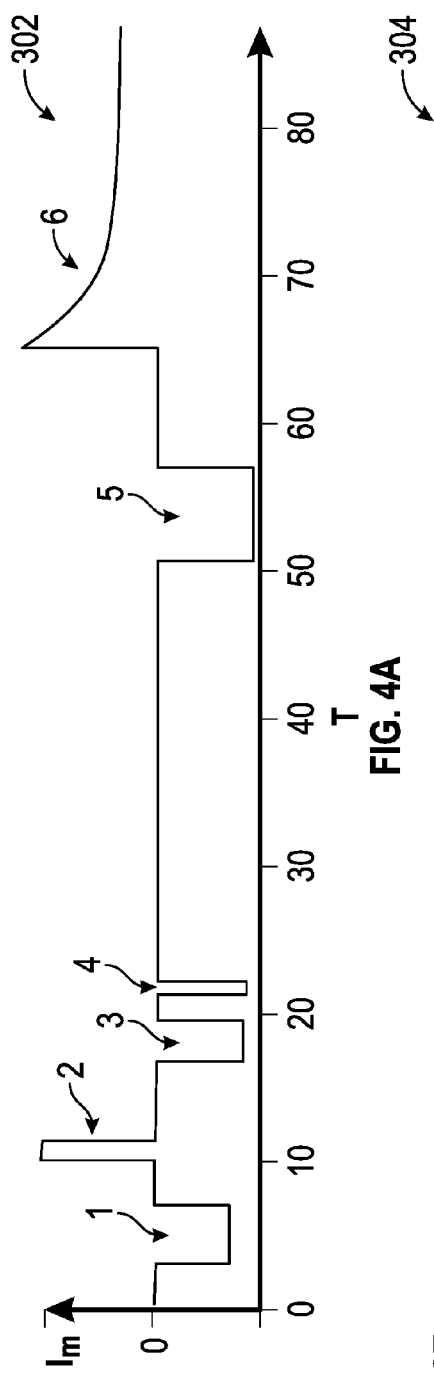
FIG. 4A is a graph of current versus time, showing a series of charging and discharging events.
Figure 4B:
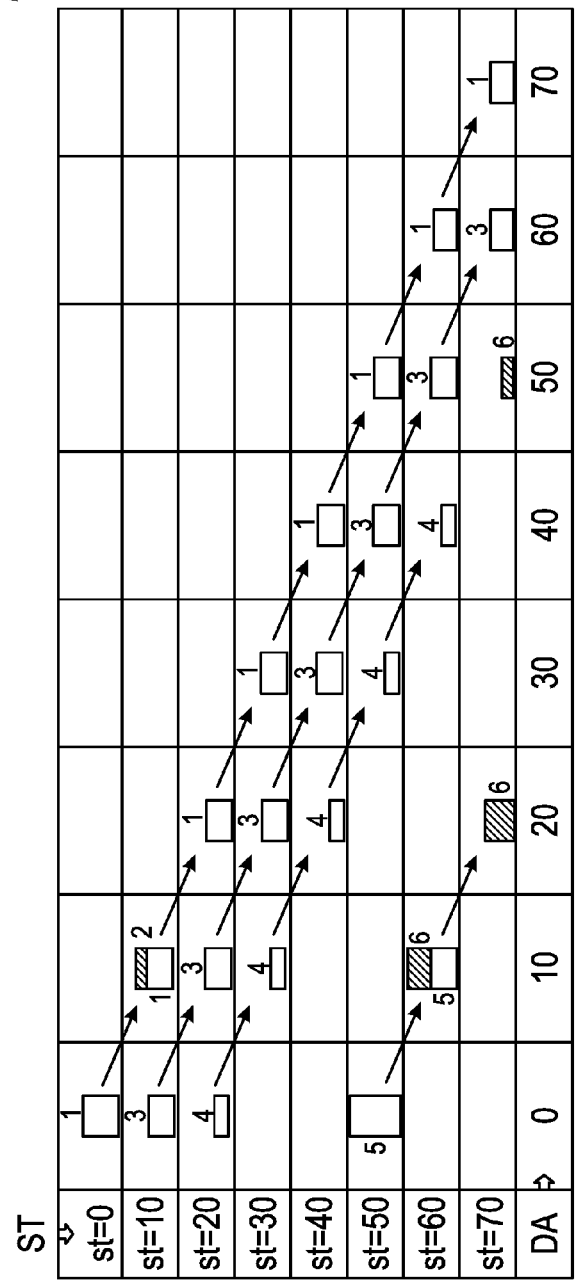
FIG. 4B is an example implementation of the method of FIG. 2, showing a set of bins corresponding to the charging and discharging events of FIG. 4A.

Referring to FIGS. 4A-4B, an example implementation of the method 100 of FIG. 2 is shown. FIGS. 4A and 4B show the growth, aging and removal of the discharge product 26. FIG. 4A shows a trace 302 illustrating a series of events 1 through 6. The vertical axis of FIG. 4A shows measured current ("$I_m$") while the horizontal axis shows time ("T"). Events 1, 3, 4 and 5 are discharging events, with a negative current value. Events 2 and 6 are charging events, with a positive current value. FIG. 4B shows a corresponding set of bins 304 for events 1 through 6. In FIG. 4B, the vertical axis reflects the starting time ("ST"), in minutes, while the horizontal axis reflects deposit age ("DA"), in minutes. The rectangles 1-6 in the set of bins 304 correspond to the events 1-6, respectively.

First, referring to FIG. 4A, between time t=0 and t=10, event 1 occurs. Accordingly in FIG. 4B, the bin (st=0, DA=0) is filled with a rectangle 1 with a size roughly corresponding to the amount of deposit created by the discharge of event 1.

Second, referring to FIG. 4A, between time t=10 and t=20, events 2 and 3 occur. Accordingly in FIG. 4B, the bin (st=10, DA=0) is filled with rectangle 3 that roughly corresponds to the amount of deposit created by the discharge of event 3. The rectangle 1 is moved down to bin (st=10, DA=10) from bin (t=0, DA=0), as this deposit has aged 10 minutes. Event 2 is a charging event that removes a portion of the deposit in the newest bin; event 2 is represented by the striped rectangle 2 in the bin (st=10, DA=10).

Third, referring to FIG. 4A, between time t=20 and t=30, event 4 occurs. Accordingly in FIG. 4B, the bin (st=20, DA=0) is filled with rectangle 4 that roughly corresponds to the amount of deposit created by the discharge of event 4. The rectangle 3 is moved down to bin (st=20, DA=10) from bin (st=10, DA=0), as this deposit has aged 10 minutes. The rectangle 1 (diminished in size due to the charging from event 2) is moved down to bin (st=20, DA=20) from bin (st=10, DA=10), as this deposit has now aged 20 minutes.

Fourth, referring to FIG. 4A, between time t=30 and t=40, no charging or discharging events occur. Accordingly in FIG. 4B, the rectangle 4 is moved down to bin (st=30, DA=10) from bin (st=20, DA=0), as this deposit has aged 10 minutes. The rectangle 3 is moved down to bin (st=30, DA=20) from bin (st=20, DA=10), as this deposit has now aged 20 minutes. The rectangle 1 is moved down to bin (st=30, DA=30) from bin (st=20, DA=20), as this deposit has now aged 30 minutes.

Fifth, referring to FIG. 4A, between time T=40 and T=50, no charging or discharging events occur. Accordingly in FIG. 4B, the rectangle 4 is moved down to bin (st=40, DA=20) from bin (st=30, DA=10), as this deposit has aged 20 minutes. The rectangle 3 is moved down to bin (st=40, DA=30) from bin (st=30, DA=20), as this deposit has now aged 30 minutes. The rectangle 1 is moved down to bin (st=40, DA=40) from bin (st=30, DA=30), as this deposit has now aged 40 minutes.

Sixth, referring to FIG. 4A, between time T=50 and T=60, event 5 occurs. Accordingly in FIG. 4B, the bin (st=50, DA=0) is filled with rectangle 5 that roughly corresponds to the amount of deposit created by the discharge of event 5. The rectangle 4 is moved down to bin (st=50, DA=30) from bin (st=40, DA=20), as this deposit has aged 30 minutes. The rectangle 3 is moved down to bin (st=50, DA=40) from bin (st=40, DA=30), as this deposit has now aged 40 minutes. The rectangle 1 is moved down to bin (st=50, DA=50) from bin (st=40, DA=40), as this deposit has now aged 50 minutes.

Seventh, referring to FIG. 4A, between time T=60 and T=70, event 6 occurs. Event 6 is a charging event that removes a portion of the deposit in the newest bin; event 6 is represented by the striped rectangle 6 in the bin (st=60, DA=10). The rectangle 5 is moved down to bin (st=60, DA=10) from bin (st=50, DA=0) as it has aged 10 minutes; it is also reduced in size due to charging event 6. The rectangle 4 is moved down to bin (st=60, DA=40) from bin (st=50, DA=30), as this deposit has aged 40 minutes. The rectangle 3 is moved down to bin (st=60, DA=50) from bin (st=50, DA=40), as this deposit has now aged 50 minutes. The rectangle 1 is moved down to bin (st=60, DA=60) from bin (st=50, DA=50), as this deposit has now aged 60 minutes.

Eighth, referring to FIG. 4A, between time T=70 and T=80, event 6 continues to occur. The rectangle 6 is moved to bin (st=70, DA=50) and the charging of event 6 now removes the deposit of rectangle 4. The rectangle 3 is moved down to bin (st=70, DA=60) from bin (st=60, DA=50), as this deposit has now aged 60 minutes. The rectangle 1 is moved down to bin (st=70, DA=70) from bin (st=60, DA=60), as this deposit has now aged 70 minutes. If charging removes all of the discharge products 26 created during a given cycle, charge characteristics default to a "bulk-sintered" state.

In summary, the process of sintering is modeled in order to give realistic projections of performance of the battery 14, particularly regeneration charge acceptance. The controller 30 (and execution of the method 100) improves the functioning of the device 12 by improving estimates of battery power capability. The method 100 may be continuously run in real-time or run as a simulation for selecting fuel economy and energy management parameters for the device 12. A real-time implementation may be used with adaptable parameters determined by a state estimator. The method 100 may improve functioning of the battery assembly 10 by improving efficiency and driveability of the device 12.

The controller 30 of FIG. 1 may be an integral portion of, or a separate module operatively connected to, other controllers of the device 12. The controller 30 includes a computer-readable medium (also referred to as a processor-readable medium), including any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which may constitute a main memory. Such instructions may be transmitted by one or more transmission media, including coaxial cables, copper wire and fiber optics, including the wires that comprise a system bus coupled to a processor of a computer. Some forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Look-up tables, databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store may be included within a computing device employing a computer operating system such as one of those mentioned above, and may be accessed via a network in any one or more of a variety of manners. A file system may be accessible from a computer operating system, and may include files stored in various formats. An RDBMS may employ the Structured Query Language (SQL) in addition to a language for creating, storing, editing, and executing stored procedures, such as the PL/SQL language mentioned above.

The detailed description and the drawings or figures are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment can be combined with one or a plurality of other desired characteristics from other embodiments, resulting in other embodiments not described in words or by reference to the drawings. Accordingly, such other embodiments fall within the framework of the scope of the appended claims.

The invention claimed is:

1. A battery assembly comprising:
a battery having first and second electrodes and an electrolyte;
a current sensor configured to obtain a measured current ($I_m$) of the battery and a voltage sensor configured to obtain a measured voltage of the battery;
a controller operatively connected to the battery, the controller including a processor and tangible, non-transitory memory on which instructions are recorded, the controller being programmed to estimate a charge acceptance capability of the battery by quantizing an accumulation and removal of a discharge product as a discharge quanta and a charge quanta, respectively, into a set of discrete bins according to a respective age;

wherein interaction of the electrolyte and at least one of the first and second electrodes produces the discharge product;

wherein execution of the instructions causes the controller to:
obtain the measured current ($I_m$), via the current sensor and the measured voltage($V_m$), via the voltage sensor;
add the discharge quanta to the set of discrete bins when the measured current ($I_m$) is negative, the discharge quanta being proportional to the measured current ($I_m$);
obtain a charge acceptance current (I) based at least partially on the measured voltage ($V_m$), an open-circuit voltage ($V_O$) and a circuit resistance ($R_o$), when the measured voltage (V) is less than the open-circuit voltage ($V_O$);
obtain the charge quanta as a product of the charge acceptance current (I) and a calculation time interval ($\Delta t$);
remove a quantity equal to the charge quanta from the set of discrete bins; and
control functioning of the battery based at least partially on the estimated charge acceptance capability.

2. The assembly of claim 1, further comprising:
wherein the controller is programmed to initialize a timer when at least one enabling condition is met; and
wherein the controller is programmed to increment the timer by the calculation time interval ($\Delta t$).

3. The assembly of claim 2, wherein the controller is programmed to:
obtain a voltage value (V) based at least partially on the measured current ($I_m$), the calculation time interval ($\Delta t$) and a predetermined set of parameters.

4. The assembly of claim 3, wherein if a bin time interval ($t_{bin}$) has elapsed, then the controller is programmed to advance the discharge quanta to a next one of the set of bins and reset the timer.

5. The assembly of claim 3, wherein the predetermined set of parameters include the open-circuit voltage ($V_O$), a circuit resistance ($R_o$), a diffusion voltage at a time t ($V_{diff(t)}$), and a time constant ($\tau$) of a circuit having a double-layer capacitance ($C_{dl}$), a double-layer voltage ($V_{dl}$) and a charge transfer resistance ($R_{ct}$).

6. The assembly of claim 5, wherein the voltage value (V) at a time t is defined as:

$$V(t)=[V_0+I_m*R_o+(I_m*\Delta t/C_{dl})+V_{dl(t-\Delta t)}*\exp(-\Delta t/\tau)+V_{diff(t-\Delta t)}].$$

7. The assembly of claim 1, wherein the charge acceptance current (I) is based at least partially on the calculation time interval ($\Delta t$), a diffusion voltage ($V_{diff(t)}$) at a time t ($V_{diff(t)}$) and a time constant ($\tau$) of a circuit having a double-layer capacitance ($C_{dl}$) and a charge transfer resistance ($R_{ct}$).

8. The assembly of claim 7, wherein the charge acceptance current (I) at a time t is defined as $I(t)=(F_1/F_2)$, such that $F_1=[V_m-V_0-V_{dl(t-\Delta t)}*\exp(-\Delta t/\tau)-V_{diff(t-\Delta t)}]$ and $F_2=[R_o+(\Delta t/C_{dl})]$.

9. A method of controlling a battery assembly, the assembly including a controller, a current sensor, a voltage sensor, a battery with first and second electrodes and an electrolyte, the method comprising:
obtaining a measured current ($I_m$) of the battery, via the current sensor;
obtaining a measured voltage of the battery, via the voltage sensor;
estimating a charge acceptance capability of the battery, via the controller, by quantizing an accumulation and a removal of a discharge product as a discharge quanta and a charge quanta, respectively, into a set of discrete bins according to a respective age, the interaction of the electrolyte and at least one of the first and second electrodes producing the discharge product;
controlling functioning of the battery based at least partially on the estimated charge acceptance capability, via the controller; and
wherein said estimating the charge acceptance capability of the battery includes:
adding the discharge quanta to the set of discrete bins when the measured current ($I_m$) is negative, the discharge quanta being proportional to the measured current ($I_m$), via the controller;
obtaining a charge acceptance current (I) based at least partially on the measured voltage ($V_m$), an open-circuit voltage ($V_O$) and a circuit resistance ($R_o$), when the measured voltage ($V_m$) is less than the open-circuit voltage ($V_O$), via the controller;
obtaining the charge quanta as a product of the charge acceptance current (I) and a calculation time interval ($\Delta t$), via the controller;
removing a quantity equal to the charge quanta from the set of discrete bins, via the controller.

10. The method of claim 9, further comprising:
obtaining the charge acceptance current (I) based at least partially on the calculation time interval ($\Delta t$), a diffusion voltage ($V_{diff(t)}$) at a time t ($V_{diff(t)}$) and a time constant ($\tau$) of a circuit having a double-layer capacitance ($C_{dl}$) and a charge transfer resistance ($R_{ct}$), via the controller.

11. The method of claim 9, further comprising:
initializing a timer when at least one enabling condition is met; and
incrementing the timer by the calculation time interval ($\Delta t$).

12. The method of claim 11, further comprising:
if a bin time interval ($t_{bin}$) has elapsed, advancing the discharge quanta to a next one of the set of bins and resetting the timer, via the controller.

13. The method of claim 9, further comprising:
obtaining a voltage value (V) based at least partially on the measured current ($I_m$), the calculation time interval ($\Delta t$) and a predetermined set of parameters, via the controller.

14. The method of claim 13, wherein the predetermined set of parameters include the open-circuit voltage ($V_O$), a circuit resistance ($R_o$), a diffusion voltage at a time t ($V_{diff(t)}$), and a time constant ($\tau$) of a circuit having a double-layer capacitance ($C_{dl}$), a double-layer voltage ($V_{dl}$) and a charge transfer resistance ($R_{ct}$).

15. The method of claim 14, further comprising obtaining the voltage value (V) at a time t as:

$$V(t)=[V_0+I_m*R_o+(I_m*\Delta t/C_{dl})+V_{dl(t-\Delta t)}*\exp(-\Delta t/\tau)+V_{diff(t-\Delta t)}].$$

16. The method of claim 15, further comprising obtaining the charge acceptance current (I) at the time t as:
$I(t)=(F_1/F_2)$, wherein $F_1=[V_m-V_0-V_{dl(t-\Delta t)}*\exp(-\Delta t/\tau)-V_{diff(t-\Delta t)}]$ and $F_2=[R_o+(\Delta t/C_{dl})]$.

* * * * *